(12) United States Patent
Cheng et al.

(10) Patent No.: US 10,896,854 B2
(45) Date of Patent: Jan. 19, 2021

(54) FORMING FINS UTILIZING ALTERNATING PATTERN OF SPACERS

(71) Applicant: International Business Machines Corporation, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 15/468,394

(22) Filed: Mar. 24, 2017

(65) Prior Publication Data
US 2018/0005898 A1 Jan. 4, 2018

Related U.S. Application Data

(62) Division of application No. 15/197,314, filed on Jun. 29, 2016, now Pat. No. 9,685,440.

(51) Int. Cl.
| | |
|---|---|
| *H01L 21/8234* | (2006.01) |
| *H01L 27/088* | (2006.01) |
| *H01L 29/66* | (2006.01) |
| *H01L 21/84* | (2006.01) |
| *H01L 21/308* | (2006.01) |
| *H01L 21/8238* | (2006.01) |

(Continued)

(52) U.S. Cl.
CPC ........ *H01L 21/823468* (2013.01); *H01L 21/02167* (2013.01); *H01L 21/02271* (2013.01); *H01L 21/3086* (2013.01); *H01L 21/823431* (2013.01); *H01L 21/823481* (2013.01); *H01L 21/823821* (2013.01); *H01L 21/845* (2013.01); *H01L 27/0886* (2013.01); *H01L 29/6653* (2013.01); *H01L 29/6656* (2013.01); *H01L 27/1211* (2013.01)

(58) Field of Classification Search
CPC ......... H01L 29/6653; H01L 21/823431; H01L 21/823821
See application file for complete search history.

(56) References Cited

U.S. PATENT DOCUMENTS

| | | | |
|---|---|---|---|
| 6,955,961 B1 | 10/2005 | Chung | |
| 8,048,788 B2 | 11/2011 | Hautala et al. | |

(Continued)

OTHER PUBLICATIONS

List of IBM Patents or Patent Applications Treated as Related.

*Primary Examiner* — Amar Movva
(74) *Attorney, Agent, or Firm* — Randall Bluestone; Ryan, Mason & Lewis, LLP

(57) ABSTRACT

A method of forming a semiconductor structure includes forming a first pattern of alternating spacers of a first material and a second material on a semiconductor substrate, forming a second pattern of the alternating spacers of the first material and the second material by selectively removing at least a portion of at least one of one or more of the spacers of the first material and one or more of the spacers of the second material to form a remaining pattern of spacers of the first material and the second material on the semiconductor substrate, and transferring the second pattern of the spacers of the first material and the second material to the semiconductor substrate to form two or more fins in the semiconductor substrate by etching the semiconductor substrate selective to the first material and the second material.

20 Claims, 10 Drawing Sheets

(51) Int. Cl.
H01L 21/02 (2006.01)
H01L 27/12 (2006.01)

(56) References Cited

U.S. PATENT DOCUMENTS

| | | |
|---|---|---|
| 8,486,610 B2 | 7/2013 | Abatchev et al. |
| 8,735,272 B2 | 5/2014 | Cai et al. |
| 8,846,477 B2 | 9/2014 | Cai et al. |
| 8,853,015 B1 * | 10/2014 | Kuo ................. H01L 21/76224 |
| | | 257/347 |
| 9,123,654 B2 | 9/2015 | Leobandung |
| 9,318,574 B2 | 4/2016 | Cheng et al. |
| 9,331,166 B2 | 5/2016 | Alptekin et al. |
| 2008/0305636 A1 * | 12/2008 | Kim .................... H01L 21/0337 |
| | | 438/696 |
| 2011/0269282 A1 * | 11/2011 | Kawasaki ........... H01L 21/2652 |
| | | 438/285 |
| 2013/0065326 A1 * | 3/2013 | Sudo .................... H01L 27/228 |
| | | 438/3 |
| 2014/0145248 A1 | 5/2014 | Cheng et al. |
| 2014/0203376 A1 | 7/2014 | Xie et al. |
| 2015/0340466 A1 * | 11/2015 | Fukuda ............... H01L 29/7848 |
| | | 257/190 |
| 2016/0079063 A1 | 3/2016 | Lee et al. |
| 2016/0093502 A1 | 3/2016 | Cheng et al. |
| 2016/0093611 A1 | 3/2016 | Cheng et al. |

* cited by examiner

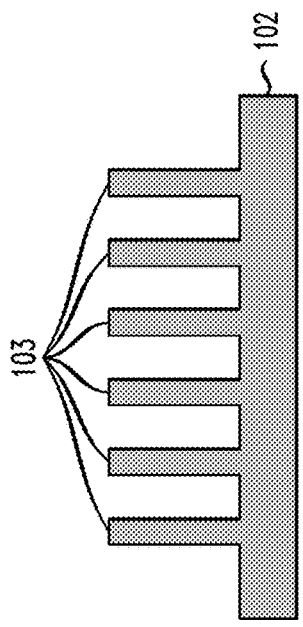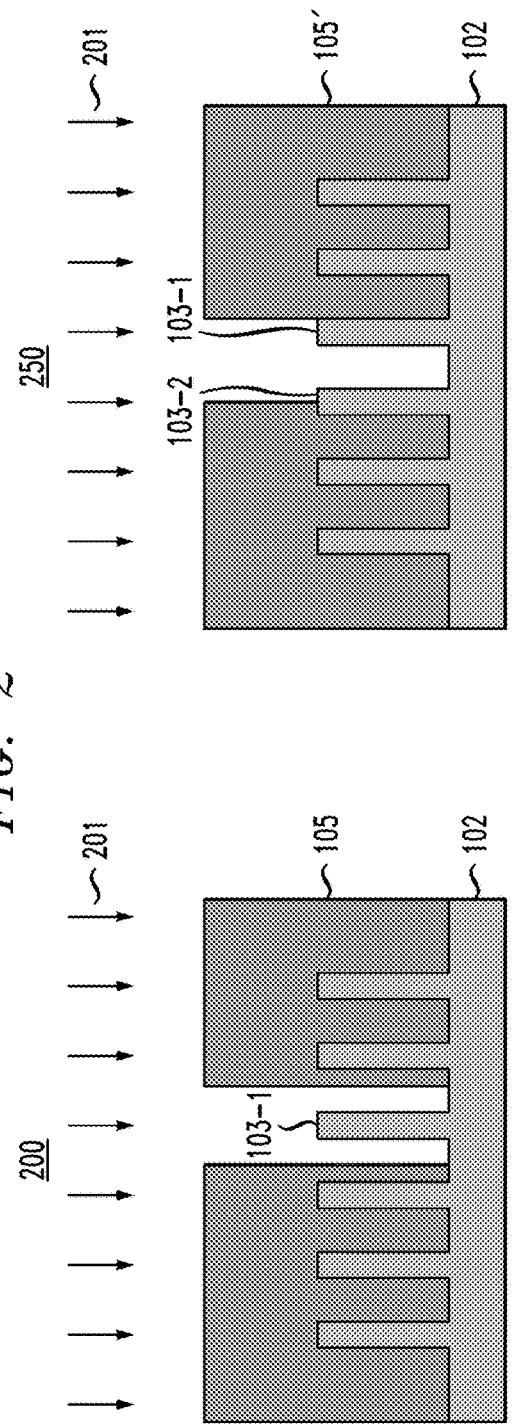

300

400

500

600

700

800

1000

1050

1100

1150

1200

1250

1300

1350

1400

1450

US 10,896,854 B2

FORMING FINS UTILIZING ALTERNATING PATTERN OF SPACERS

BACKGROUND

The present application relates to semiconductors, and more specifically, to techniques for forming semiconductor structures. Various types of field-effect transistor (FET) devices may be used in semiconductor structures, integrated circuits and other electronic devices. Fin FETs (FinFETs) are a type of FET device, where fins are patterned on a substrate.

SUMMARY

Embodiments of the invention provide techniques for forming fins in a substrate using an alternating pattern of spacers.

For example, in one embodiment a method comprises forming a first pattern of alternating spacers of a first material and a second material on a semiconductor substrate, forming a second pattern of the alternating spacers of the first material and the second material by selectively removing at least a portion of at least one of one or more of the spacers of the first material and one or more of the spacers of the second material to form a remaining pattern of spacers of the first material and the second material on the semiconductor substrate, and transferring the second pattern of the spacers of the first material and the second material to the semiconductor substrate to form two or more fins in the semiconductor substrate by etching the semiconductor substrate selective to the first material and the second material.

BRIEF DESCRIPTION OF THE DRAWINGS

FIG. 1 depicts a side cross-sectional view of fins formed on a substrate, according to an embodiment of the invention.

FIG. 2 depicts side cross-sectional views of a cut mask formed over the FIG. 1 structure, according to an embodiment of the invention.

DETAILED DESCRIPTION

Figure 3:
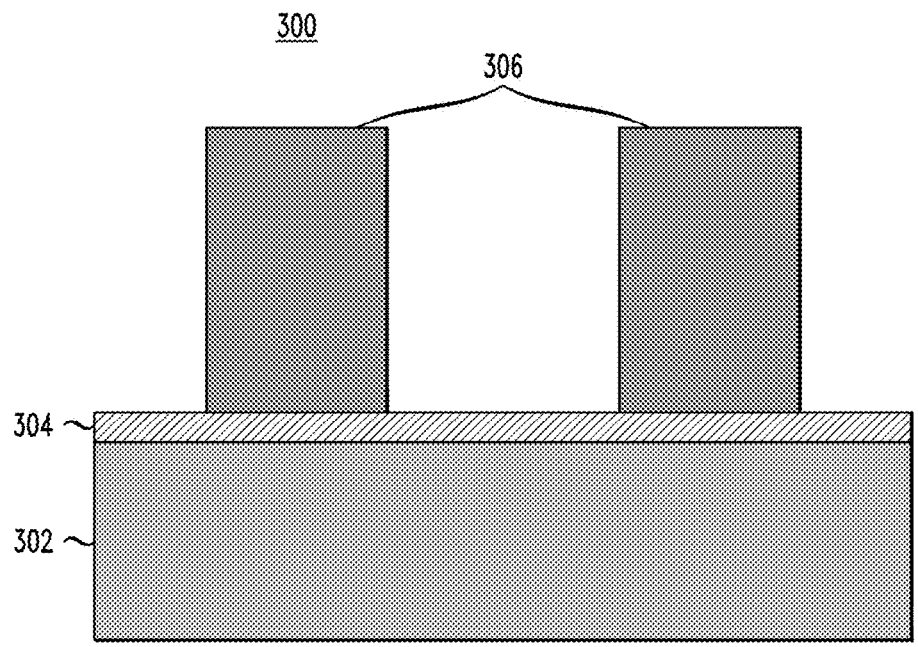
FIG. 3 depicts a side cross-sectional view of mandrels formed on a pad layer over a substrate, according to an embodiment of the invention.

Illustrative embodiments of the invention may be described herein in the context of illustrative methods for forming fins using silicon nitride and oxide spacers, along with illustrative apparatus, systems and devices having fins formed using alternating spacers of a first material and a second material. However, it is to be understood that embodiments of the invention are not limited to the illustrative methods, apparatus, systems and devices but instead are more broadly applicable to other suitable methods, apparatus, systems and devices.

In FinFET fabrication, fins may be formed using patterning friendly techniques. For example, sidewall image transfer (SIT) patterning may be used to form fins over a portion of a substrate, such as over an entire substrate, followed by removal of unwanted fins using a fin cut mask. To reduce the size of devices such as FinFETs, it may be desired to shrink fin pitch, and thus fins are becoming closer together. As the spacing between fins continues to decrease, it is difficult or impossible to cut unwanted fins without compromising adjacent desired device fins. Embodiments provide techniques to at least partially overcome these and other disadvantages to form FinFET and other devices with tight fin pitch.

FIG. 1 depicts a side cross-sectional view 100 of a substrate 102 having fins 103 formed therein. The substrate 102 may by a bulk silicon substrate or a semiconductor-on-insulator (SOI) substrate in some embodiments. The structure shown in FIG. 1 may be formed using SIT patterning. As discussed above, as the fin pitch shrinks to 30 nm and below, it is more difficult to remove unwanted fins from the FIG. 1 structure, due in part to misalignment of a cut mask, variation in critical dimension (CD) of the fins, overlay variation, etc. FIG. 2 illustrates both an aligned cut mask and a misaligned cut mask.

FIG. 2 depicts a side cross-sectional view 200 of a cut mask 105 formed over the substrate 102 in an ideal scenario wherein the cut mask 105 is perfectly aligned, as well as a side cross-sectional view 250 of a cut mask 105' formed over the substrate 102 in a real-world scenario wherein the cut mask 105' is misaligned. In the view 200, the cut mask 105 is perfectly aligned, in that the only fin exposed by the cut mask 105 is unwanted fin 103-1. In the real-world scenario shown in view 250, misalignment has occurred, and the cut mask 105' exposes a portion but not all of unwanted fin 103-1 as well as a portion of fin 103-2. This misalignment thus causes undesired exposure and damage of a device fin (e.g., 103-2) as well as incomplete removal of the dummy fin (e.g., 103-1). As discussed above, misalignment such as that shown in view 250 is more likely to occur as fin pitch shrinks.

FIG. 3 depicts a side cross-sectional view 300 of a substrate 302, having a pad layer 304 formed therein and mandrels 306 formed on the pad layer 304. The substrate 302 may be a silicon substrate, such as a bulk semiconductor or SOI wafer. The substrate 302 may be silicon (Si), germanium (Ge), silicon germanium (SiGe), silicon carbide (SiC), and other materials including group III-V semiconductor compounds. Such group III-V semiconductor compounds may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1, with 1 being the total relative mole quantity. Other suitable materials for substrate 302 include group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1, with 1 being the total relative mole quantity. In some embodiments, the substrate 302 may be an organic semiconductor or a layered semiconductor such as Si/SiGe, a silicon-on-insulator or a SiGe-on-insulator, etc. A portion of or the entire substrate 302 may be amorphous, polycrystalline, or monocrystalline. In addition to the aforementioned types of materials, the substrate 302 in some embodiments may be a hybrid oriented (HOT) semiconductor substrate. Such a HOT substrate may have surface regions of different crystallographic orientation. The substrate 302 may be doped, undoped, or contain both doped and undoped regions therein. The substrate 302 may also include regions with strain and regions without strain therein, as well as regions of tensile strain and compressive strain.

The substrate 302 may range in thickness as needed for a particular device, such as between 10 micrometers (μm) to 1 millimeter (mm) in some embodiments.

The pad layer 304 may comprise, for example, silicon oxynitride (SiON), although other suitable materials may be used including but not limited to silicon carbide nitride (SiCN), silicon oxy carbide nitride (SiOCN), silicon boron carbide nitride (SiBCN). In some embodiments, the pad layer 304 ranges in thickness from 10 nanometers (nm) to 100 nm.

The mandrels 306 may be amorphous silicon (aSi), although other suitable materials may be used such as amorphous SiGe, polycrystalline Si, polycrystalline SiGe. The mandrels 306 may be formed by depositing an aSi layer over the entirety of the pad layer 304, followed by using a resist mask to pattern the aSi layer into mandrels 306. The mandrels 306 may have a thickness or height ranging from 30 nm to 150 nm in some embodiments. Although FIG. 3 shows an embodiment wherein two mandrels 306 are formed, embodiments are not so limited. Any number of mandrels may be formed on pad layer 304 as needed for a particular device.

Figure 4:
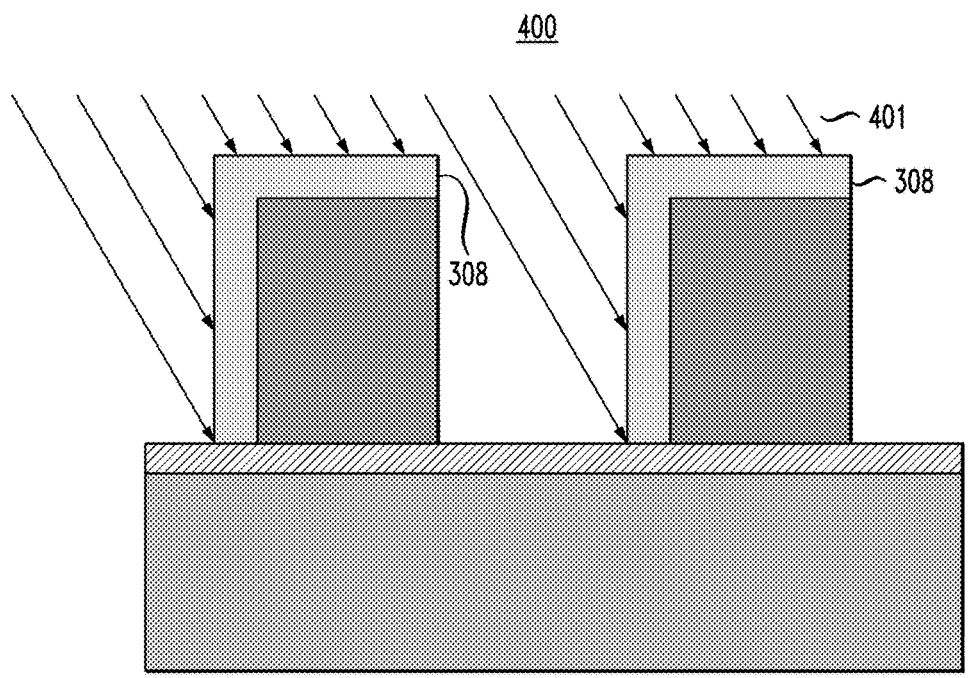
FIG. 4 depicts a side cross-sectional view of the FIG. 3 structure following deposition of layers of a first material on one side and tops of the mandrels, according to an embodiment of the invention.

FIG. 4 depicts a side cross-sectional view 400 of the FIG. 3 structure following deposition of layer 308 on a first side and on tops of the mandrels 306. Tilted gas cluster ion beam (GCIB) deposition may be used to form layer 308. The angle of the titled GCIB deposition is chosen such that the spacer material or layer 308 may be deposited on the entire sidewalls of the mandrels 306. In some embodiments, the layer 308 is a first material such as silicon nitride (SiN), although other suitable materials may be used including but not limited to SiON, SiCN, SiOCN. The layer 308, in some embodiments, ranges in thickness from 6 nm to 20 nm. More generally, the first material of layer 308 may be any material that can be deposited via tilted GCIB and etched (along with a second material forming layer 310 to be described below) selective to the material of the mandrels 306.

Figure 5:
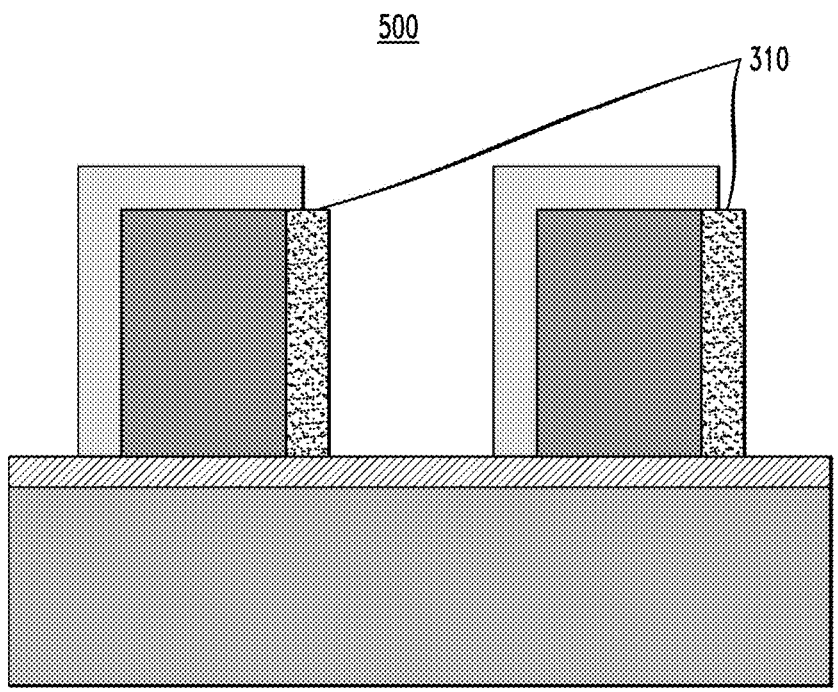
FIG. 5 depicts a side cross-sectional view of the FIG. 4 structure following formation of spacers of a second material, according to an embodiment of the invention.

FIG. 5 depicts a side cross-sectional view 500 of the FIG. 4 structure following formation of layer 310 on a second side of the mandrels 306 opposite the first side having layer 308 formed thereon. In some embodiments, the layer 310 may be a second material such as an oxide formed by oxidation of the mandrels 306. As the top and first sides of the mandrels 306 are protected by the layer 308, no oxide is formed on those sides of the mandrels 306. As mentioned above, the second material is not required to be an oxide, provided that the second material can be formed by chemical reaction on the exposed mandrel sidewalls, but not on the mandrel sidewalls protected by the first material. For example, in the case of oxidation, oxygen reacts with silicon to form silicon oxide on the exposed silicon mandrel sidewalls. The silicon nitride on the other side of the mandrel sidewalls protects the formation of oxide as silicon nitride is a good oxygen diffusion barrier so that oxygen cannot penetrate through the nitride to reach the silicon mandrel sidewalls to form silicon oxide. In some embodiments, carbon may be used to react with silicon mandrels 306 such that the layer 310 is SiC. More generally, the first material of layer 308 and the second material of layer 310 should be selected such that they may be etched selective to the material of the mandrels 306.

Figure 6:
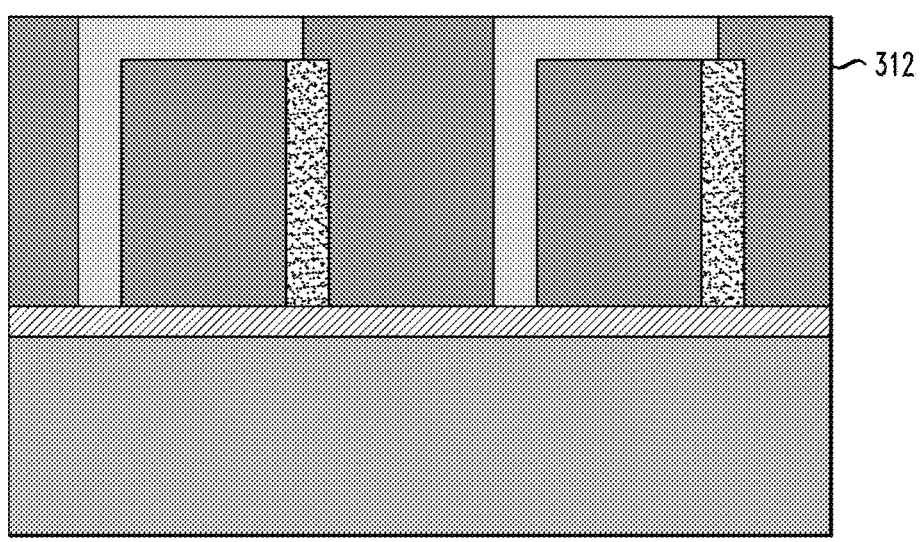
FIG. 6 depicts a side cross-sectional view of the FIG. 5 structure following deposition of material in gaps between the mandrels, according to an embodiment of the invention.

FIG. 6 depicts a side cross-sectional view of the FIG. 6 structure following formation of layer 312 to fill gaps between the mandrels 306. The layer 312 may be deposited and planarized such that its top surface is coplanar with a top of the layer 308 on the top of mandrels 306. In some embodiments, the layer 312 is formed of aSi similar to the mandrels 306. More generally, the layer 312 may be formed of any material such that it and the material of mandrels 306 may be etched selective to the first material of layer 308 and the second material of layer 310.

Figure 7:
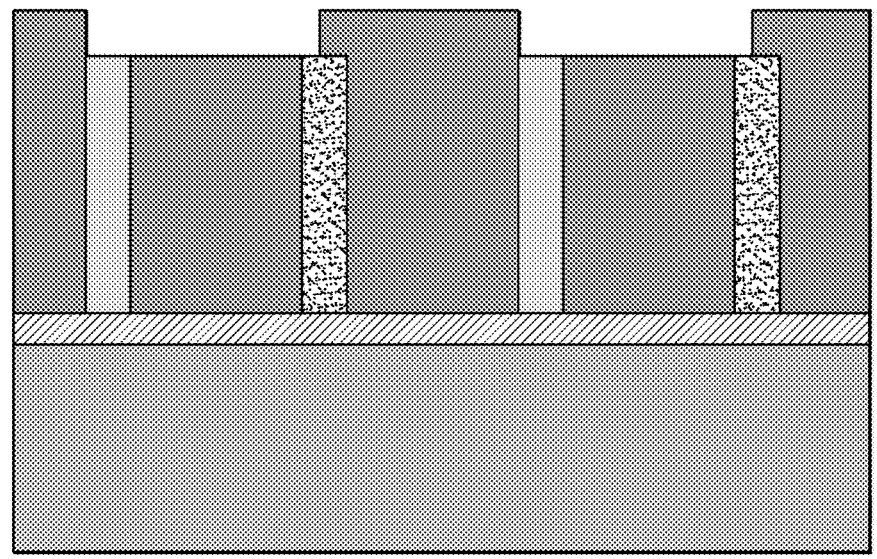
FIG. 7 depicts a side cross-sectional view of the FIG. 6 structure following removal of the first material from tops of the mandrels, according to an embodiment of the invention.

FIG. 7 depicts a side cross-sectional view 700 of the FIG. 6 structure following removal of the layer 308 from the tops of mandrels 306. Removal of the layer 308 may be performed using, for example, reactive-ion etching (RIE).

Figure 8:
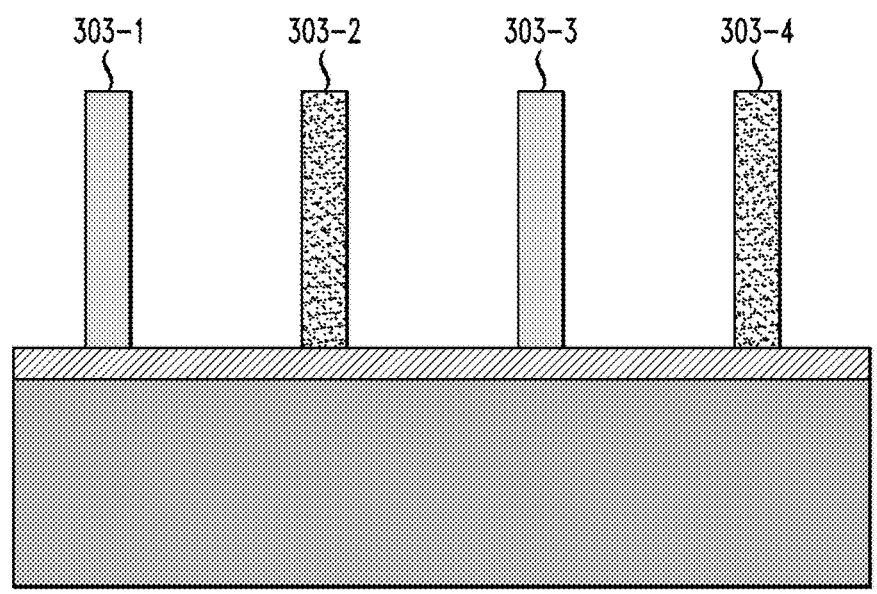
FIG. 8 depicts a side cross-sectional view of the FIG. 7 structure following removal of the mandrels and material filling the gaps between the mandrels to form an alternating pattern of spacers of the first material and the second material, according to an embodiment of the invention.

FIG. 8 depicts a side cross-sectional view 800 of the FIG. 7 structure following removal of the mandrels 306 and layer 312. The mandrels 306 and layer 312 may be removed using an etchant that is selective to the first material of layer 308 and the second material of layer 310. For example, the mandrels 306 and material 312 may be formed of aSi, the layer 308 may be SiN and the layer 310 may be an oxide. In such a case, the etchant used may be an aqueous solution containing ammonia ($NH_3$), or a dry etch process containing sulfur hexafluoride ($SF_6$). The resulting structure shown in FIG. 8 has a pattern of spacers 303-1, 303-2, 303-3 and 303-4 collectively referred to herein as spacers 303. Advantageously, the spacers 303 are of alternating materials—spacers 303-1 and 303-3 are formed of the first material of layer 308 (e.g., SiN) while spacers 303-2 and 303-4 are formed of the second material of layer 310 (e.g., an oxide). As will be described in further detail below with respect to FIGS. 9-14, such an alternating pattern facilitates the removal of unwanted or dummy spacers/fins in substrate 302.

Figure 9A:
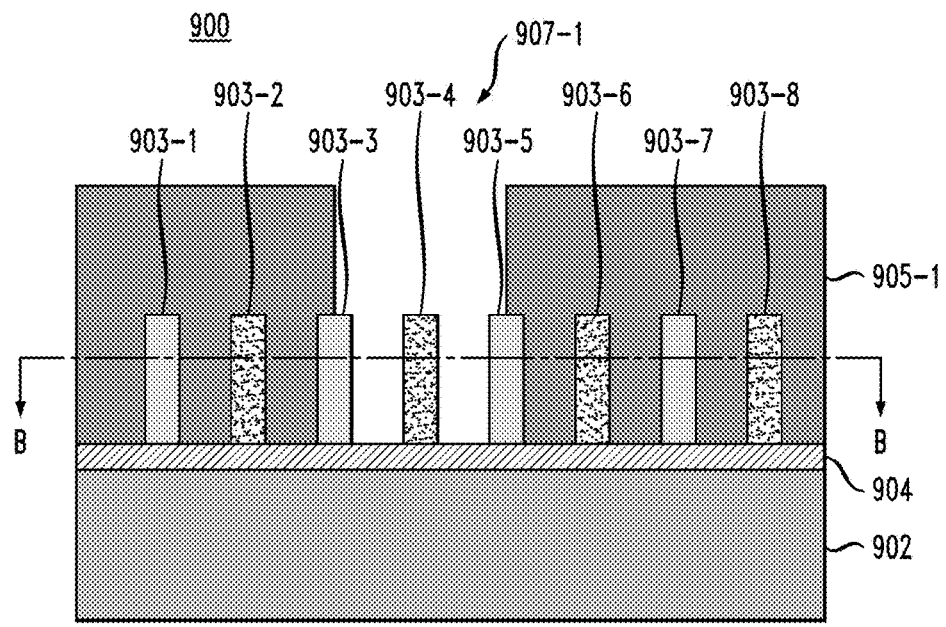
FIG. 9A depicts a side cross-sectional view of a structure having an alternating pattern of spacers of the first material and the second material with a cut mask formed thereon, according to an embodiment of the invention.

FIG. 9A depicts a side-cross sectional view 900 of a structure including substrate 902, pad layer 904 formed on the substrate 902 and spacers 903-1, 903-2, 903-3, 903-4, 903-5, 903-6, 903-7 and 903-8 collectively referred to herein as spacers 903 formed on the pad layer 904. The spacers 903 are formed in an alternating pattern of a first material and a second material.

The structure shown in view 900 is similar to that of the structure shown in view 800 of FIG. 8, with the exception of the number of spacers 903 and the total width of the structure. Substrate 902 is similar in size (thickness but not necessarily width) and composition as substrate 302, while pad layer 904 is similar in size (thickness but not necessarily width) and composition as pad layer 304. The spacers 903 may be formed in a manner similar to the described above with respect to formation of spacers 303. Spacers 903-1, 903-3, 903-5 and 903-7 are formed of the first material, e.g., the material of layer 308 such as SiN, while spacers 903-2, 903-4, 903-6 and 903-8 are formed of the second material, e.g., the material of layer 310 such as an oxide.

Figure 9B:
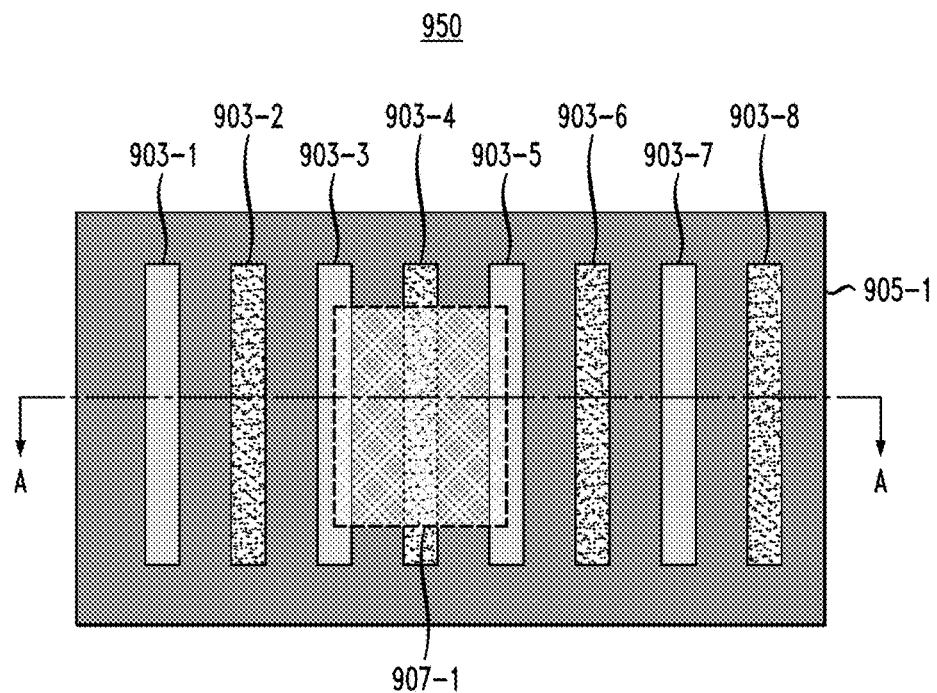
FIG. 9B depicts a top cross-sectional view of the FIG. 9A structure, according to an embodiment of the invention.

FIG. 9B depicts a top cross-sectional view 950 of the FIG. 9A structure. The top cross-sectional view 950 of FIG. 9B is taken along the line B-B shown in FIG. 9A. The side cross-sectional view 900 of FIG. 9A is taken along the line A-A shown in FIG. 9B.

As shown in FIGS. 9A and 9B, a cut mask 905-1 is formed over the spacers 903, except for an exposed portion 907-1. The exposed portion 907-1 exposes a dummy spacer, 903-4, that will be removed. The cut mask 905-1, or masking layer 905-1, may be formed by spin-on coating and patterning the masking layer 905-1 to leave open exposed portion 907-1 by photolithography. The cut mask 905-1 may be formed of photoresist, although other suitable materials may be used. The cut mask 905-1 is at least as thick or tall as the spacers 903, and may range in thickness or height from 50 nm to 200 nm.

As shown in FIG. 9B, the exposed portion 907-1 does not necessarily include the entirety of dummy spacer 903-4. In the example shown in FIGS. 9A and 9B, only a portion of the length of dummy spacer 903-4 is left exposed by exposed portion 907-1 of cut mask 905-1. In other embodiments, the entirety of dummy spacer 903-4 may be exposed by exposed portion 907-1 of cut mask 905-1. Further, in some embodiments two or more discontinuous portions of the dummy spacer 903-4 may be removed by using distinct exposed portions of cut mask 905-1. Moreover, while FIGS. 9A and 9B illustrate an example of a cut mask with just a single exposed potion 907-1 exposing a portion of one dummy spacer of the second material, embodiments are not so limited. The cut mask 905-1 in other embodiments may include multiple exposed portions that expose portions of two or more different ones of the spacers 903 that are formed of the second material.

Because the spacers 903 are formed in an alternating pattern of different materials, it is acceptable for the exposed portion 907-1 of the cut mask 905-1 to land on adjacent spacers 903-3 and 903-5. This is because the dummy spacer 903-4 may be removed selective to adjacent spacers 903-3 and 903-5 as the dummy spacer 903-4 is formed of the second material, e.g., an oxide, while the spacers 903-3 and 903-5 are formed of the first material, e.g., SiN.

Figure 10A:
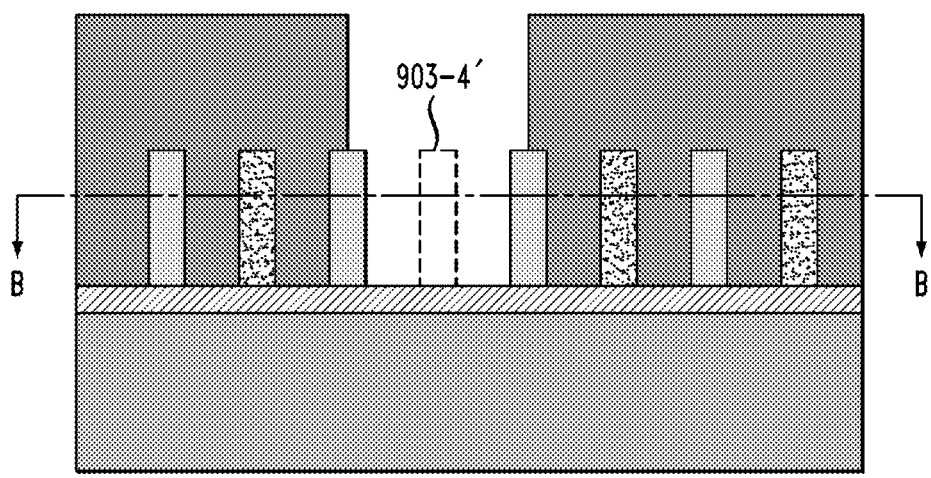
FIG. 10A depicts a side cross-sectional view of the FIG. 9A structure following removal of a spacer of the second material, according to an embodiment of the invention.

FIG. 10A depicts a side cross-sectional view 1000 of the FIG. 9A structure following removal of the portion of the dummy spacer 903-4 exposed by exposed portion 907-1 of cut mask 905-1. The dummy spacer 903-4, which may be formed of the second material such as an oxide, may be removed by a wet etch containing hydrofluoric acid, or a dry etch (chemical oxide removal). The removed dummy spacer 903-4 is shown in dashed outline 903-4' in FIG. 10A.

Figure 10B:
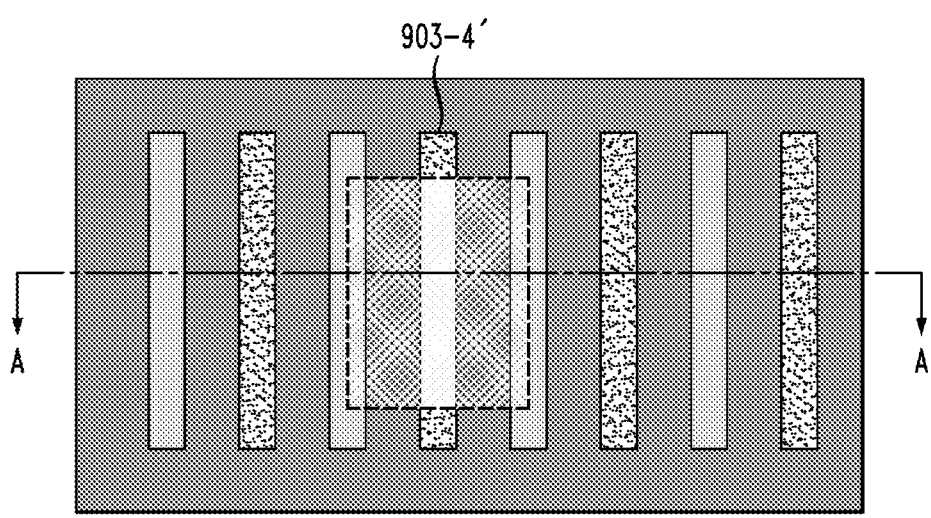
FIG. 10B depicts a top cross-sectional view of the FIG. 10A structure, according to an embodiment of the invention.

FIG. 10B depicts a top cross-sectional view 1050 of the FIG. 10A structure. The top cross-sectional view 1050 of FIG. 10B is taken along the line B-B shown in FIG. 10A. The side cross-sectional view 1000 of FIG. 10A is taken along the line A-A shown in FIG. 10B.

Figure 11A:
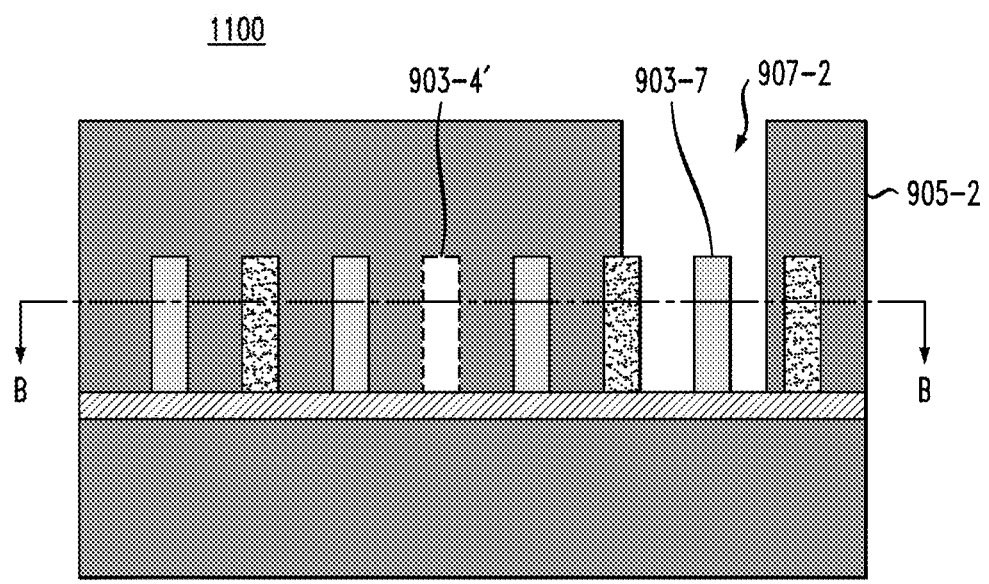
FIG. 11A depicts a side cross-sectional view of the FIG. 10A structure following formation of another cut mask, according to an embodiment of the invention.
Figure 11B:
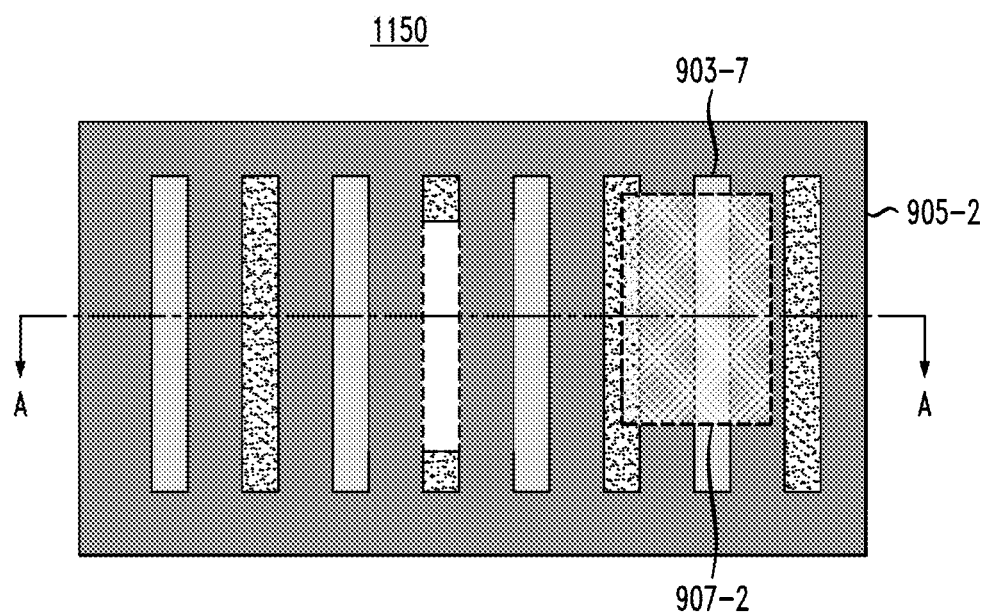
FIG. 11B depicts a top cross-sectional view of the FIG. 11A structure, according to an embodiment of the invention.

The processing described above with respect to FIGS. 9A, 9B, 10A and 10B may be repeated to remove one or more portions of one or more of the spacers 903 that are formed of the first material. FIG. 11A shows a side cross-sectional view 1100 of the FIG. 10A structure after the cut mask 905-1 is removed and replaced with cut mask 905-2 having exposed portion 907-2. The cut mask 905-1 may be removed by ashing (for example, oxygen plasma can be used to selectively remove the photoresist mask). The cut mask 905-2 may be similar in thickness or height and composition to the cut mask 905-1, and may be formed using processing similar to that described above with respect to cut mask 905-1. FIG. 11B depicts a top cross-sectional view 1150 of the FIG. 11A structure. The top cross-sectional view 1150 of FIG. 11B is taken along the line B-B shown in FIG. 11A. The side cross-sectional view 1100 of FIG. 9A is taken along the line A-A shown in FIG. 11B.

As shown in FIGS. 11A and 11B, the exposed portion 907-2 exposes a portion of the dummy spacer 903-7 formed of the first material, e.g., SiN. Similar to the cut mask 905-1, it is acceptable for the cut mask 905-2 to land on adjacent spacers 903-6 and 903-8 as the spacers 903-6 and 903-8 are formed of the second material while the spacer 903-7 is formed of the first material, where the first material may be removed selective to the second material. The exposed portion 907-2 does not include the entirety of dummy spacer 903-7. In the example shown in FIGS. 11A and 11B, the exposed portion 907-2 of cut mask 905-2 exposes only a portion of the length of dummy spacer 903-7. In other embodiments, however, the entirety of dummy spacer 903-7 may be left exposed by the exposed portion 907-2 of cut mask 905-2, or two or more discontinuous portions of the dummy spacer 903-7 and/or one or more portions of other ones of the spacers 903 formed of the first material may be left exposed by multiple exposed portions of the cut mask 905-2.

Figure 12A:
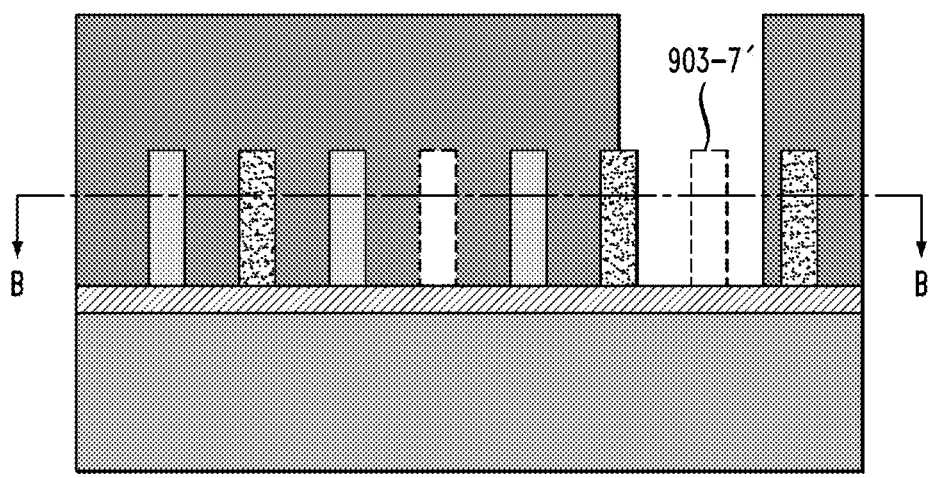
FIG. 12A depicts a side cross-sectional view of the FIG. 11A structure following removal of a spacer of the first material, according to an embodiment of the invention.

FIG. 12A depicts a side cross-sectional view 1200 of the FIG. 11A structure following removal of the portion of the dummy spacer 903-7 exposed by exposed portion 907-2 of cut mask 905-2. The dummy spacer 903-7, which may be formed of the first material such as SiN, may be removed by an aqueous etch solution containing phosphoric acid. The removed dummy spacer 903-7 is shown in dashed outline 903-7' in FIG. 12A.

Figure 12B:
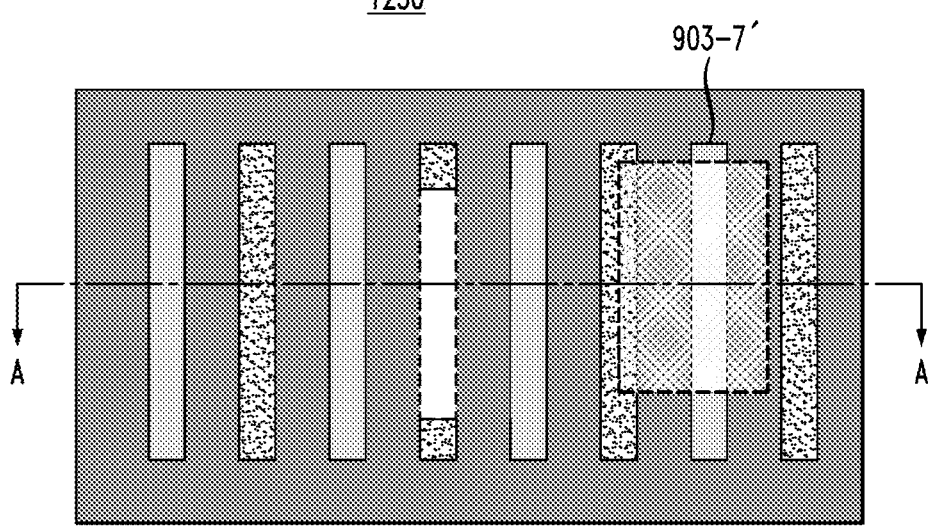
FIG. 12B depicts a top cross-sectional view of the FIG. 12A structure, according to an embodiment of the invention.

FIG. 12B depicts a top cross-sectional view 1250 of the FIG. 12A structure. The top cross-sectional view 1250 of FIG. 12B is taken along the line B-B shown in FIG. 12A. The side cross-sectional view 1200 of FIG. 12A is taken along the line A-A shown in FIG. 12B.

Figure 13A:
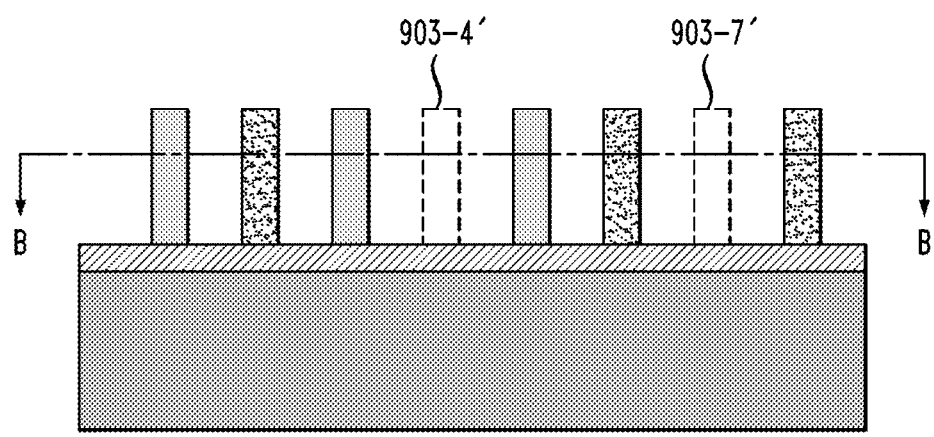
FIG. 13A depicts a side cross-sectional view of the FIG. 12A structure following removal of the cut mask, according to an embodiment of the invention.

FIG. 13A depicts a side cross-sectional view 1300 of the FIG. 12A structure following removal of the cut mask 905-2. The cut mask 905-2 may be removed in a manner similar to that described above with respect to removal of cut mask 905-1. The removed portions of dummy spacers 903-4 and 903-7 are shown in dashed outlines 903-4' and 903-7', respectively.

Figure 13B:
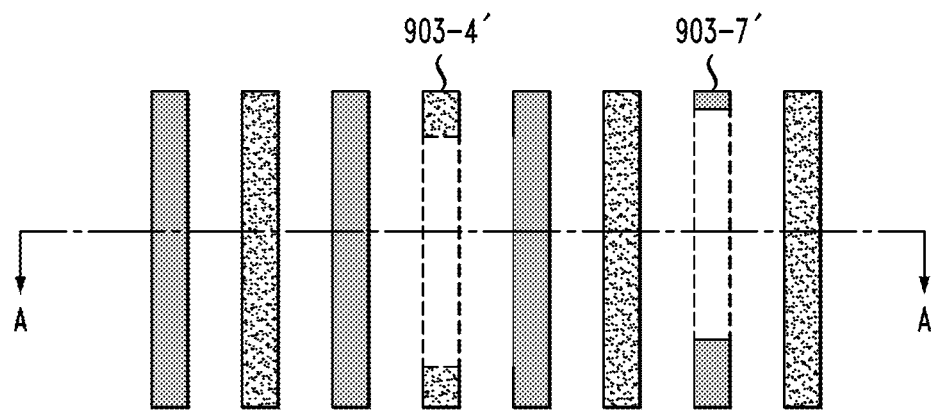
FIG. 13B depicts a top cross-sectional view of the FIG. 13A structure, according to an embodiment of the invention.

FIG. 13B depicts a top cross-sectional view 1350 of the FIG. 13A structure. The top cross-sectional view 1350 of FIG. 13B is taken along the line B-B shown in FIG. 13A. The side cross-sectional view 1300 of FIG. 13A is taken along the line A-A shown in FIG. 13B. The pad layer 904 is not shown in the top cross-sectional view 1350 of FIG. 13B for clarity of illustration.

Figure 14A:
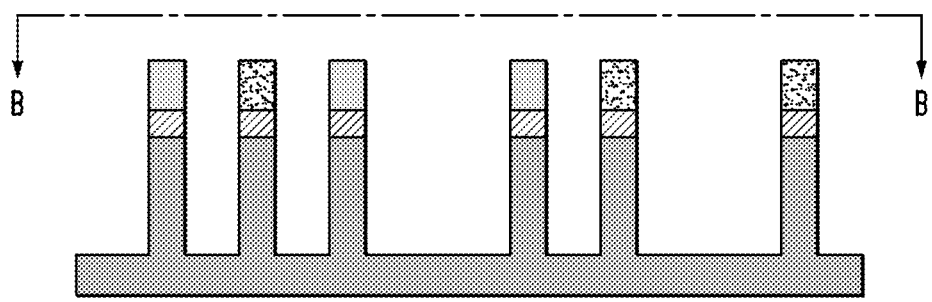
FIG. 14A depicts a side cross-sectional view of the FIG. 13A structure following transferring the remaining spacer pattern to the substrate, according to an embodiment of the invention.

FIG. 14A depicts a side cross-sectional view 1400 of the FIG. 13A structure following transfer of the remaining pattern of spacers 903 into the substrate 902 to form fins in the substrate 902. Transfer of this pattern may be achieved by RIE.

Figure 14B:
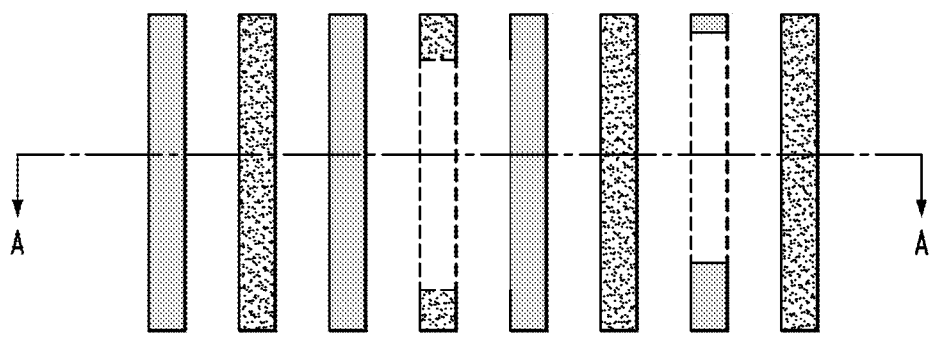
FIG. 14B depicts a top view of the FIG. 14A structure, according to an embodiment of the invention.

FIG. 14B depicts a top view 1450 of the FIG. 14A structure. The top view 1450 of FIG. 14B is taken along the line B-B shown in FIG. 14A. The side cross-sectional view 1400 of FIG. 14A is taken along the line A-A shown in FIG. 14B. The substrate 902 is not shown in the top view 1450 of FIG. 14B for clarity of illustration.

As described above, embodiments provide for forming SIT patterns with two different SIT spacers using tilted GCIB deposition and thermal oxidation. Thus, fin patterns with tight fin pitch, e.g., fin pitch less than 30 nm in some embodiments, can be formed even when a fin cut mask lands on spacers that are adjacent to dummy spacers in a structure. For example, the pitch of the remaining pattern shown in the FIG. 14A structure may be N×P, where N is an integer and P is a minimal pitch.

In some embodiments, a method of forming a semiconductor structure comprises forming a first pattern of alternating spacers of a first material and a second material on a semiconductor substrate, forming a second pattern of the alternating spacers of the first material and the second material by selectively removing at least a portion of at least one of one or more of the spacers of the first material and one or more of the spacers of the second material to form a remaining pattern of spacers of the first material and the second material on the semiconductor substrate, and transferring the second pattern of the spacers of the first material and the second material to the semiconductor substrate to form two or more fins in the semiconductor substrate by etching the semiconductor substrate selective to the first material and the second material. The first material may comprise SiN and the second material may comprise an oxide. A fin pitch between at least two of the fins may be less than 30 nm.

Forming the first pattern in some embodiments includes forming the semiconductor substrate, forming a pad layer over the semiconductor substrate, depositing a first semiconductor layer over the pad layer and patterning the first semiconductor layer into two or more mandrels. The semiconductor substrate may comprise one of bulk semiconductor and a SOI, the pad layer may comprise SiON, the first semiconductor layer may comprise aSi, the first material may comprise SiN and the second material may comprise an oxide. Forming the first pattern may further include depositing the first material on a first side and a top of each of the two or more mandrels, oxidizing the two or more mandrels to form the spacers of the second material on a second side of each of the two or more mandrels, depositing and planarizing a second semiconductor layer to fill one or more gaps between the two or more mandrels, removing the first material from the top of each of the two or more mandrels, and removing the first semiconductor layer and the second semiconductor layer to leave the first pattern of alternating spacers of the first material and the second material on the semiconductor substrate. Depositing the first material may utilize tilted GCIB deposition, removing the first material from the top of each of the mandrels may utilize RIE, and removing the first semiconductor layer and the second silicon layer may utilize an amorphous silicon etchant selective to the first material and the second material.

In some embodiments, forming the second pattern comprises forming a mask layer over the spacers of the first material and the second material, the mask layer leaving an exposed portion comprising at least a portion of at least one of the spacers of the first material, etching the exposed portion to remove said portion of said at least one spacer of the first material, and removing the mask layer. The exposed portion may comprise at least a portion of at least one spacer of the second material adjacent to said at least one spacer of the first material.

In other embodiments, forming the second pattern may include forming a first mask layer over the spacers of the first material and the second material, the first mask layer leaving a first exposed portion comprising at least a portion of at least one spacer of the first material, etching the first exposed portion to remove said portion of said at least one spacer of the first material, removing the first mask layer, forming a second mask layer over the spacers of the first material and the second material, the second mask layer leaving a second exposed portion, the second exposed portion comprising at least a portion of at least spacers of the second material, and etching the second exposed portion to remove said portion of said at least one spacer of the second material. The first exposed portion may comprise at least a portion of at least one spacer of the second material adjacent to said at least one spacer of the first material, and the second exposed portion may comprise at least a portion of at least one spacer of the first material adjacent to said at least one spacer of the second material.

The above-described method may be used to form a semiconductor structure or integrated circuit. Such a semiconductor structure or integrated circuit may comprise a substrate and two or more fins formed in the substrate in a given pattern, each of the two or more fins having a pad layer formed on a top surface thereof and a spacer formed over a top of the pad layer. The given pattern may comprise alternating spacers of a first material and a second material with at least a portion of the one of the spacers removed via a cut mask. A fin pitch between at least two of the fins may be less than 30 nm in some embodiments. For example, fin width (lateral) may be approximately 4-10 nm, while fin height may be approximately 30-150 nm and the fin pitch between closest fins may be 30 nm or less. The first material may be SiN and the second material may be an oxide.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), metal-oxide-semiconductor field-effect transistors (MOSFETs), and/or FinFETs. By way of nonlimiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a substrate; and
two or more fins formed in the substrate in a given pattern, each of the two or more fins having a pad layer formed on a top surface thereof and a spacer formed over a top of the pad layer;
wherein the given pattern comprises alternating spacers of a first material and a second material with at least a portion of one of the spacers removed via a cut mask;
wherein the alternating spacers comprise a first spacer formed over a first one of the two or more fins that comprises the first material but not the second material adjacent at least a second spacer formed over a second one of the two or more fins that comprises the second material but not the first material, the second material being different than the first material;
wherein a top surface of the first spacer is substantially coplanar with a top surface of the second spacer; and
wherein the pad layer of each of the two or more fins is a third material different than the first material and the second material.

2. The semiconductor structure of claim 1, wherein a fin pitch between at least two of the fins is less than 30 nanometers.

3. The semiconductor structure of claim 1, wherein the first material comprises a nitride and the second material comprises an oxide.

4. The semiconductor structure of claim 1, wherein the substrate comprises one of bulk semiconductor and a semiconductor-on-insulator.

5. The semiconductor structure of claim 1, wherein the pad layer comprises silicon oxynitride.

6. The semiconductor structure of claim 1, wherein the pad layer comprises at least one of silicon carbide nitride, silicon oxy carbide nitride and silicon boron carbide nitride.

7. The semiconductor structure of claim 1, wherein the first material comprises silicon nitride.

8. The semiconductor structure of claim 1, wherein the first material comprises at least one of silicon oxynitride, silicon carbide nitride, silicon oxy carbide nitride and silicon boron carbide nitride.

9. The semiconductor structure of claim 1, wherein the first material comprises a material configured:
for deposition via tilted gas cluster ion beam deposition; and
for etching selective to the second material.

10. The semiconductor structure of claim 1, wherein the second material comprises an oxide.

11. The semiconductor structure of claim 1, wherein the second material comprises silicon carbide.

12. An integrated circuit, comprising:
a semiconductor substrate; and
two or more fins formed in the semiconductor substrate in a given pattern, each of the two or more fins having a pad layer formed on a top surface thereof and a spacer formed over a top of the pad layer;
wherein the given pattern comprises alternating spacers of a first material and a second material with at least a portion of one of the spacers removed via a cut mask;
wherein the alternating spacers comprise a first spacer formed over a first one of the two or more fins that comprises the first material but not the second material adjacent at least a second spacer formed over a second one of the two or more fins that comprises the second material but not the first material, the second material being different than the first material;
wherein a top surface of the first spacer is substantially coplanar with a top surface of the second spacer; and
wherein the pad layer of each of the two or more fins is a third material different than the first material and the second material.

13. The integrated circuit of claim 12, wherein a fin pitch between at least two of the fins is less than 30 nanometers.

14. The integrated circuit of claim 12, wherein the first material comprises a nitride and the second material comprises an oxide.

15. The integrated circuit of claim 12, wherein the pad layer comprises at least one of silicon oxynitride, silicon carbide nitride, silicon oxy carbide nitride and silicon boron carbide nitride.

16. The integrated circuit of claim 12, wherein the first material comprises silicon nitride.

17. The integrated circuit of claim 12, wherein the first material comprises at least one of silicon nitride, silicon oxynitride, silicon carbide nitride, silicon oxy carbide nitride and silicon boron carbide nitride.

18. The integrated circuit of claim 12, wherein the first material comprises a material configured:
for deposition via tilted gas cluster ion beam deposition; and
for etching selective to the second material.

19. The integrated circuit of claim 12, wherein the second material comprises an oxide.

20. The integrated circuit of claim 12, wherein the second material comprises silicon carbide (SiC).

* * * * *